(12) United States Patent
Molfese et al.

(10) Patent No.: US 9,352,955 B2
(45) Date of Patent: May 31, 2016

(54) MEMS PRESSURE SENSOR WITH IMPROVED INSENSITIVITY TO THERMO-MECHANICAL STRESS

(71) Applicant: Maxim Integrated Products, Inc., San Jose, CA (US)

(72) Inventors: Antonio Molfese, Carugate (IT); Luca Coronato, Corsico (IT); Gabriele Cazzaniga, Rosale (IT); Luigi Esposito, Bologna (IT)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 14/537,898

(22) Filed: Nov. 10, 2014

(65) Prior Publication Data
US 2015/0274505 A1    Oct. 1, 2015

Related U.S. Application Data

(60) Provisional application No. 61/971,393, filed on Mar. 27, 2014.

(51) Int. Cl.
*H01L 21/84* (2006.01)
*B81B 3/00* (2006.01)
*B81C 1/00* (2006.01)

(52) U.S. Cl.
CPC ........... *B81B 3/0078* (2013.01); *B81C 1/00682* (2013.01); *B81B 2201/0264* (2013.01); *B81B 2203/0127* (2013.01)

(58) Field of Classification Search
CPC .......... H01L 21/00; H01L 21/28; H01L 29/84
USPC ................................................. 257/415–418
See application file for complete search history.

(56) References Cited

U.S. PATENT DOCUMENTS

| | | | | |
|---|---|---|---|---|
| 4,996,082 A | * | 2/1991 | Guckel | G01L 9/0042 427/255.15 |
| 5,531,121 A | * | 7/1996 | Sparks | B81C 1/00246 257/E21.218 |
| 5,610,431 A | * | 3/1997 | Martin | G01P 1/023 257/415 |
| 5,759,870 A | * | 6/1998 | Yun | B81C 1/00047 438/445 |
| 5,883,420 A | * | 3/1999 | Mirza | G01L 9/0045 257/415 |
| 6,362,018 B1 | * | 3/2002 | Xu | H01G 5/16 438/50 |
| 7,491,566 B2 | * | 2/2009 | Brosnihan | B81C 1/00182 257/417 |
| 7,795,695 B2 | * | 9/2010 | Weigold | B81C 1/00246 181/167 |
| 8,945,985 B2 | * | 2/2015 | Kim | H01L 24/19 438/107 |
| 2004/0126921 A1 | * | 7/2004 | Volant | H01H 59/0009 438/52 |
| 2004/0237285 A1 | * | 12/2004 | Rangsten | G01L 9/0042 29/592.1 |
| 2012/0261830 A1 | * | 10/2012 | Chu | B81C 1/00039 257/774 |
| 2013/0233086 A1 | * | 9/2013 | Besling | G01L 9/12 73/724 |
| 2014/0300249 A1 | * | 10/2014 | Van Kampen | B81C 1/00039 310/300 |

* cited by examiner

*Primary Examiner* — Michael Lebentritt
(74) *Attorney, Agent, or Firm* — North Weber & Baugh LLP

(57) ABSTRACT

This invention relates generally to semiconductor manufacturing and packaging and more specifically to semiconductor manufacturing in MEMS (Microelectromechanical systems) inertial sensing products. Embodiments of the present invention improve pressure sensor performance (e.g., absolute and relative accuracy) by increasing pressure insensitivity to changes in thermo-mechanical stress. The pressure insensitivity can be achieved by using the array of pressure sensing membranes, suspended sensing electrodes, and dielectric anchors.

12 Claims, 7 Drawing Sheets

MEMS PRESSURE SENSOR WITH IMPROVED INSENSITIVITY TO THERMO-MECHANICAL STRESS

CROSS REFERENCE TO RELATED APPLICATIONS

This application claims the benefit of U.S. Provisional Application No. 61/971,393, filed Mar. 27, 2014.

BACKGROUND

A. Technical Field

This invention relates generally to semiconductor manufacturing and packaging and more specifically to semiconductor manufacturing in MEMS (Microelectromechanical systems) sensing products.

B. Background of the Invention

A microelectromechanical structure (MEMS) is widely applied as a sensor to measure acceleration, rotation, pressure and many other physical parameters. The MEMS device is normally formed on a silicon substrate using a micromachining process, and thus, adopts characteristic feature sizes of several micrometers. Such miniaturized devices transduce mechanical movement to electrical signals that may indicate the level of the interested parameters. Examples of the MEMS device include accelerometers, gyroscopes, magnetometers, and pressure sensors. Various MEMS devices have been widely employed in applications ranging from common consumer products to specialized products used under extreme environments, and nowadays, they may be easily found in automotive parts, mobile phones, gaming devices, medical appliance, and military applications.

Many MEMS devices rely on capacitive sensing between a moveable electrode and a stationary electrode, and one example of such MEMS devices is a micro-machined pressure sensor. The pressure sensor measures pressure by measuring the deflection of a membrane using a capacitive read-out. The pressure sensor comprises a moveable electrode and a fixed sensing electrode, spaced by a defined gap wherein the movable electrode deforms in response to the pressure difference between the external pressure and a reference pressure in a sealed cavity. The capacitive change may be induced by variation of the capacitive gap or area of the sensing capacitor that is associated with the relative location change between the electrodes.

Thermo-mechanical stress may produce deformation of both electrodes in different way, and ultimately, lead to an offset or sensitivity drift to the sensing capacitor (sensor interface circuit) even though no pressure difference is applied to induce any capacitive change. In an ideal situation, the capacitive variation of the sensing capacitor should only be associated with the pressure difference, and does not exist when no pressure difference occurs.

However, thermo-mechanical stress may be accumulated in the MEMS device during the course of manufacturing, soldering, packaging and device aging. Non-uniform stress can build up within the substrate and the device structure including the membrane, and unavoidably cause the substrate to warp and the membrane to shift or to be deformed. The sensing output from a sensor interface circuit may reflect such displacements resulting from the non-uniform thermal stress, and lead to an offset value and a sensitivity drift for the sensed pressure.

Device performance of a capacitive pressure sensor is compromised due to the thermo-mechanical stress. Such performance degradation is commonly shared by the MEMS devices that primarily rely on membranes and capacitive electrodes for transducing and sensing mechanical movement. There is a need to compensate or reduce the impact of the thermo-mechanical stress that builds up during the course of manufacturing, packaging, assembly and regular operation.

Pressure sensor performance can vary based on stress sensitivity and temperature. A pressure sensor measures pressure by measuring the deflection of a MEMS membrane using a capacitive read-out method. Temperature and package stress can produce deformation of both electrodes in different ways, causing capacitance variation even without external pressure variation. These deformations impact sensor accuracy. A prior art solution is to reduce the impact of deformation by introducing a trench isolation inside the package surrounding sensing element. However, this method still produces inaccuracies and increases complexity and cost of the package itself.

FIG. 1 shows two cross sectional views of a MEMS pressure sensor illustrating deformation in the prior art solutions 100 and 170. FIG. 1 example 100 shows pressure sensing membrane 105, substrate 115, package 110, sealed cavity 120, and fixed sensing electrode 125. In example 100, there is no package stress or substrate. FIG. 1 example 170 shows substrate deformation and includes pressure sensing membrane 130, deformed substrate 140, package 135, sealed cavity 145, and sensing electrode 150. As is understood by one of ordinary skill in the art, FIG. 1 example 170 illustrates that the substrate deformation 140 also leads to sensing electrode deformation 150.

FIG. 1 example 170 shows the sensing membrane 130 and the cavity underneath it being hermitically closed 145. A fixed sensing electrode 150 is used to detect capacitance variation due to membrane deformation under applied pressure. On this kind of device when a substrate deformation due to package stress or temperature occurs, capacitance variation due to undesired fixed electrode or membrane deformation can be detected even without applied pressure, causing loss in sensor accuracy.

In summary what is needed is a solution for a MEMS pressure sensor reduces the unwanted effect of thermo-mechanical stress.

SUMMARY OF THE INVENTION

This invention relates generally to semiconductor manufacturing and packaging and more specifically to semiconductor manufacturing in MEMS (Microelectromechanical systems) sensing products. Embodiments of the present invention improve pressure sensor performance (e.g., absolute and relative accuracy) by increasing pressure insensitivity to changes in thermo-mechanical stress. The pressure insensitivity can be achieved by using the array of pressure sensing membranes, suspended sensing electrodes, and dielectric anchors.

Embodiments of the present invention improve pressure sensor performance (e.g., absolute and relative accuracy) by increasing pressure insensitivity to changes in thermo-mechanical stress.

In one embodiment the thermo-mechanical insensitivity is achieved using an array of pressure sensing membranes, a sealed cavity, suspended sensing electrodes, and dielectric anchors. By suspending the pressure sensors the impact of substrate deformation is reduced.

Another benefit of this innovation is it easily enabled integration in the same die of pressure sensor and other inertial sensors.

Other objects and attainments together with a fuller understanding of the invention will become apparent and appreciated by referring to the following description and claims taken in conjunction with the accompanying drawings.

BRIEF DESCRIPTION OF THE DRAWINGS

Reference will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

DETAILED DESCRIPTION OF THE PREFERRED EMBODIMENTS

The following description is set forth for purpose of explanation in order to provide an understanding of the invention. However, it is apparent that one skilled in the art will recognize that embodiments of the present invention, some of which are described below, may be incorporated into a number of different systems and devices. The embodiments of the present invention may be present in hardware, software or firmware. Structures shown below in the diagram are illustrative of exemplary embodiments of the invention and are meant to avoid obscuring the invention. Furthermore, connections between components within the figures are not intended to be limited to direct connections. Rather, data between these components may be modified, re-formatted or otherwise changed by intermediary components.

Reference in the specification to "one embodiment", "in one embodiment" or "an embodiment" etc. means that a particular feature, structure, characteristic, or function described in connection with the embodiment is included in at least one embodiment of the invention. The appearances of the phrase "in one embodiment" in various places in the specification are not necessarily all referring to the same embodiment.

Embodiments of the present invention improve pressure sensor performance (e.g., absolute and relative accuracy) by increasing pressure insensitivity to changes in thermo-mechanical stress.

Figure 1:
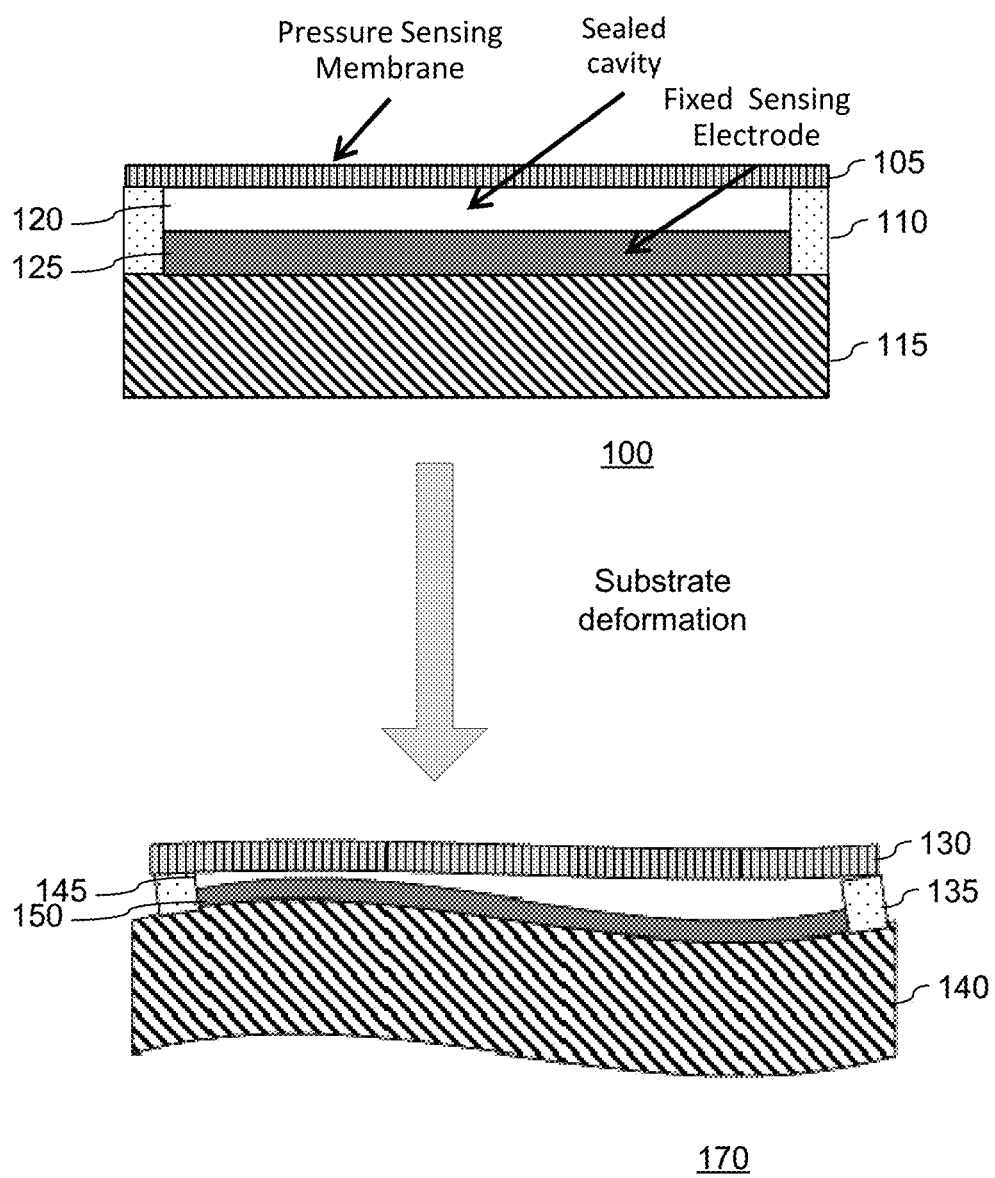
FIG. 1 shows a cross sectional view of a package deformation, illustrating shortcomings of the prior art.
Figure 2:
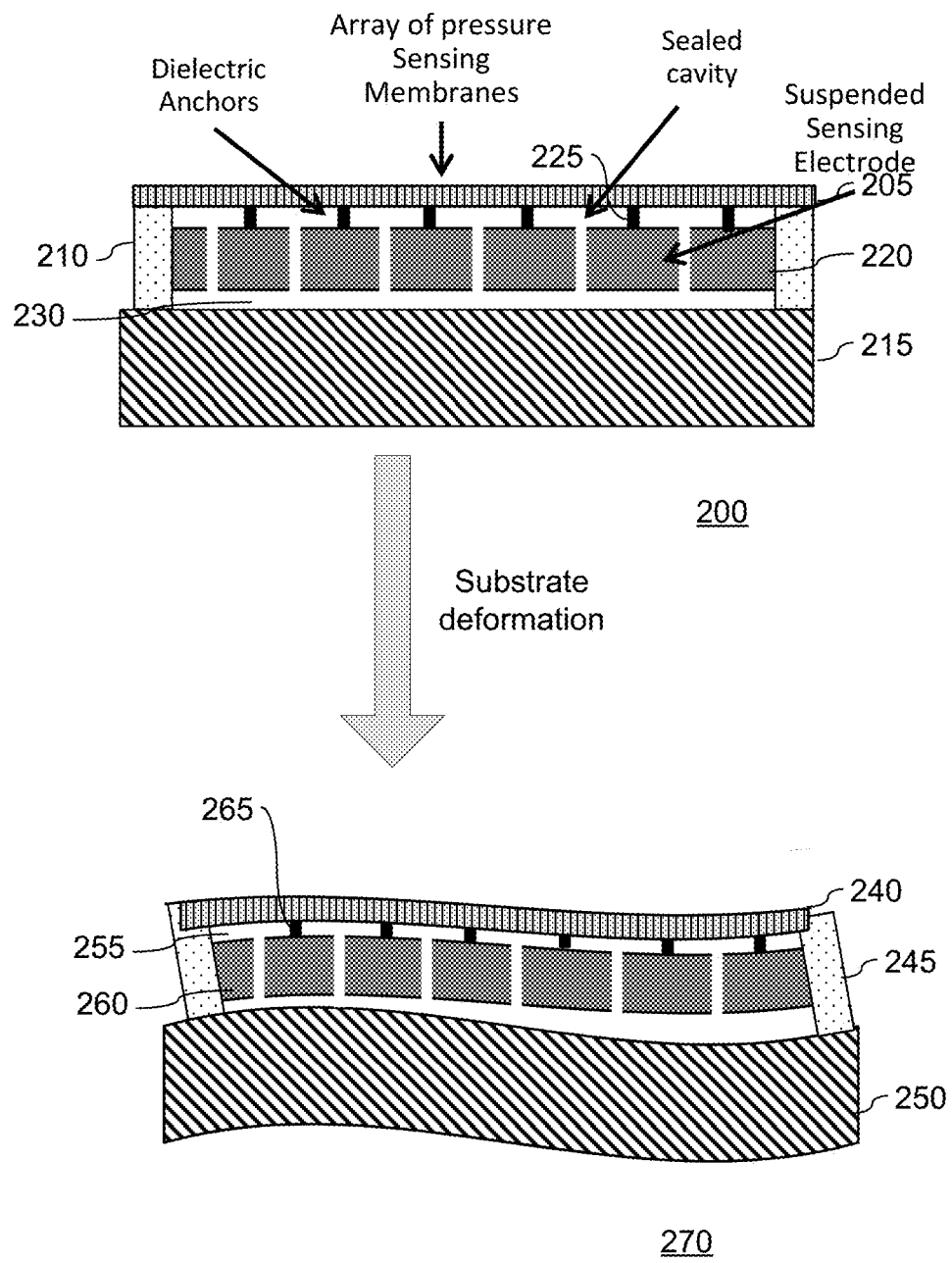
FIG. 2 shows a cross sectional view of a package, in accordance with various aspects of the present invention.

FIG. 2 shows two examples of embodiments of the present invention. One example, 200, is shown without substrate deformation. The other example, 270, is shown with substrate deformation. Example 200 shows an array of pressure sensing membranes 205, substrate 215, sealed cavity 230, structures 210, suspended sensing electrodes 220, and dielectric anchors 225. FIG. 200 also shows that by using the array of pressure sensing membranes 205, suspended sensing electrodes 220, and dielectric anchors 225, that even under substrate deformation due to thermo-mechanical stress, the sensors can maintain accurate readings.

FIG. 2 example 270 shows an array of pressure sensing membranes 240, substrate 250, sealed cavity 255, structures 245, suspended sensing electrodes 260, and dielectric anchors 265. FIG. 2 shows pressure sensing elements include an array of pressure sensing membranes 240 anchored to a movable/suspended electrode 205 and 260 using dielectric anchors 225 and 265. By suspending the sensing electrode the impact of substrate deformation is reduced.

In one embodiment, the dielectric anchors can be made of silicon dioxide. In another embodiment, the dielectric anchors can be silicon nitride. However, any dielectric material can be used.

In one embodiment, the pressure sensing membrane and sensing electrode can be poly crystalline silicon. In other embodiments other materials can be used, such as, mono crystalline silicon, aluminum, or any other material typically used in MEMS devices.

In another embodiment, suspension can be achieved by using a membrane with a plurality of pillars that act as anchors to the capacitance sensing electrode. The suspended capacitive sensing electrode can be decoupled from the substrate using appropriate elastic elements. By suspending the pressure sensors the impact of substrate deformation is reduced.

The fact that the membranes are small and locally anchored to the sensing electrode makes their relative displacements caused by thermal expansion or substrate deformation small.

Figure 3:
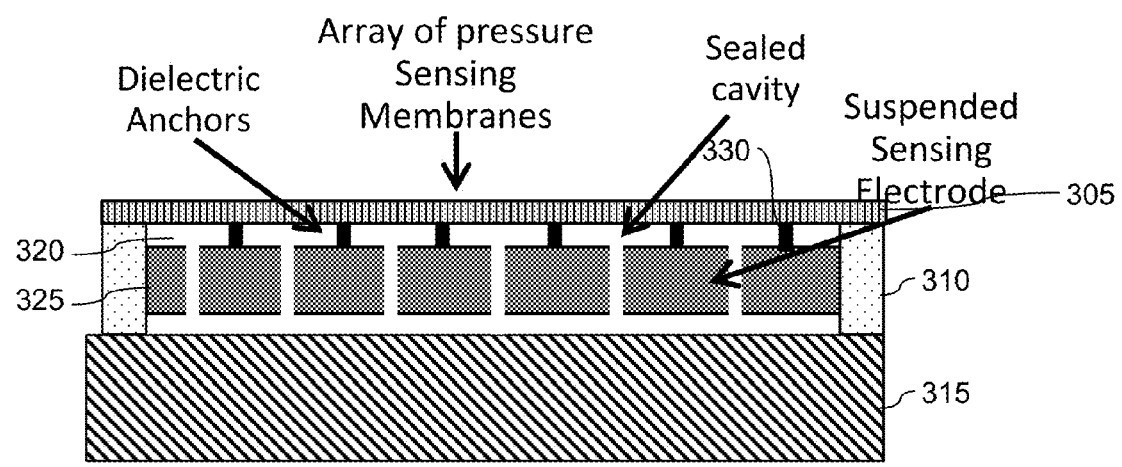
FIG. 3 shows a cross sectional view of a package, in accordance with various aspects of the present invention.
Figure 4:
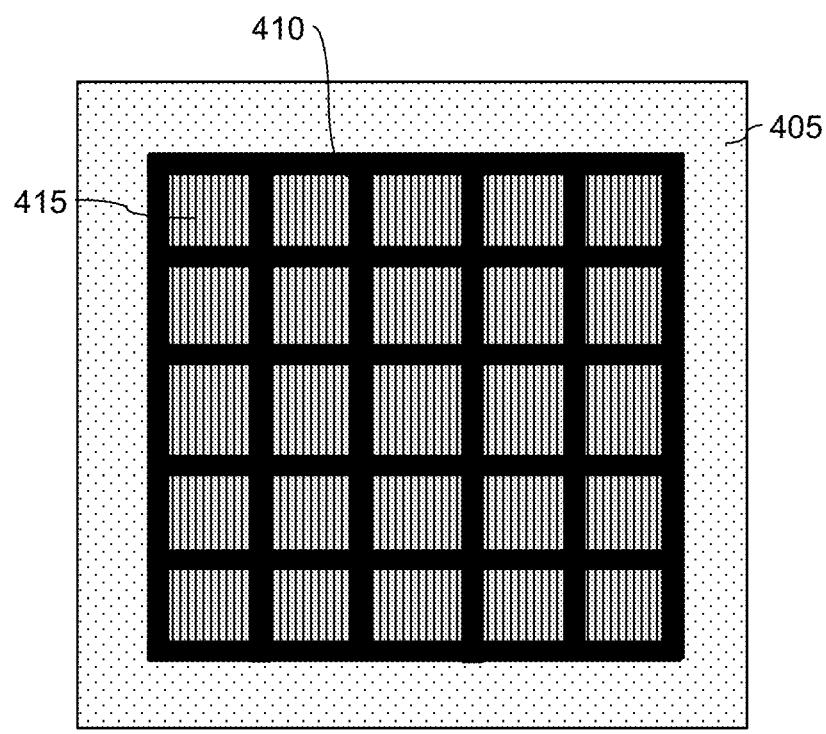
FIG. 4 shows a top view of a package, in accordance with various aspects of the present invention.

FIGS. 3 and 4 show one embodiment of a layout of the suspended electrodes. FIG. 3 shows a cross sectional view and FIG. 4 shows a top view of the layout. In the embodiment shown there is an array of 25 square membranes anchored to the sensing electrode with dielectric anchors.

FIG. 3 shows an array of pressure sensing membranes 305, substrate 315, structures 310, sealed cavity 320, suspended sensing electrodes 325, and dielectric anchors 330.

FIG. 4 shows the top view layout of the suspended sensing electrodes. FIG. 4 shows substrate 405, dielectric anchors 410, and pressure sensor membranes 415. The layout shown in FIG. 4 is an array of five by five membranes.

As will be understood by one of ordinary skill in the art, sensitivity depends on the maximum displacement of a membrane under applied pressure that is strongly dependent on its size and its thickness. Using an array of smaller membrane the maximum displacement is reduced if the thickness is kept constant. As will be understood by one of ordinary skill in the art, with the presented solution it is then necessary to reduce membrane thickness to obtain sensitivity comparable with prior art. This is not a limitation but an advantage as thinner layer are usually more compatible with typical surface micromachining and standard Complementary Metal-Oxide-Semiconductor (CMOS) process.

Advantages of the present invention over the prior art solutions can be quantified using Finite Element Method (FEM) simulation. Two capacitive sensors were compared with the same sensitivity (40 aF/hPa). When a substrate deformation typical for device in this kind of package was applied, on a prior art device 2.5 hPa of drift (without any pressure variation) were detected. Using the present invention this drift was only 0.1 hPa so it was reduced of a factor 25.

Figure 5:
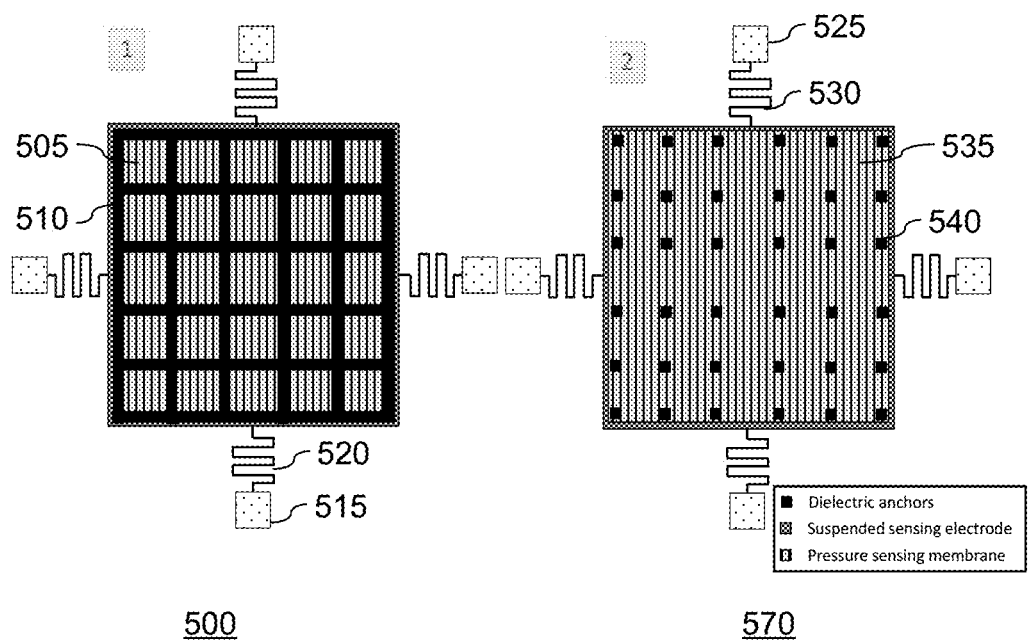
FIG. 5 shows a top view of a package, in accordance with various aspects of the present invention.

FIG. 5 shows two other embodiments of the present invention, 500 and 570. The embodiment shown in 500 shows an array of 25 square membranes 505 anchored to the sensing electrode 510 that is suspended using spring-like structures 520.

The embodiment shown in 570 shows a membrane 535 anchored to the suspended sensing electrode 530 through a square based grid of dielectric pillars 540.

Figure 6:
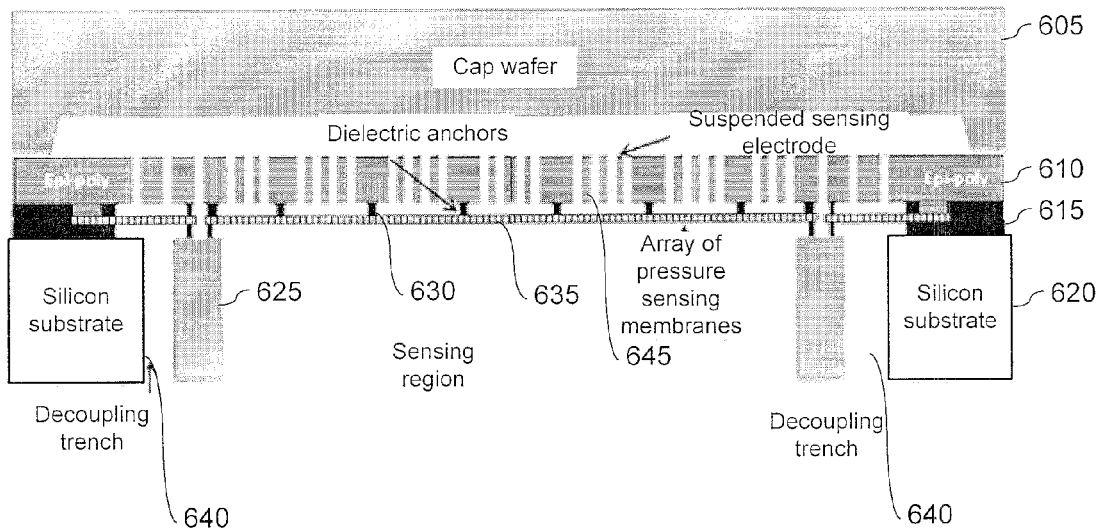
FIG. 6 shows a physical realization, in accordance with various aspects of the present invention.

FIG. 6 shows a physical realization of the present invention. FIG. 6 shows cap wafer 605, epi-poly 610, dielectric anchors 630, an array of pressure sensing electrodes 635, decoupling trenches 640, suspended sensing electrodes 645. The pressure sensor can be realized with a typical technology used for inertial sensor (accelerometers, gyroscope) with few process steps introduction.

The suspended sensing electrode 645 can be realized using the structural layer of inertial sensor that is a thick epi-poly. The array of sensing membranes 635 can be realized using the buried poly that is typically used for interconnections and out-of plane electrodes. This buried poly is typically thin so compliant with the realization of array of small membranes. Dielectric anchors 630 can be realized using residual of sacrificial oxide, removed to release epi-poly mass.

The step introduced to realize the sensor is the etching from the bottom of the substrate wafer to release the buried poly in the region of the sensor.

In one embodiment, it is also possible to realize decoupling trench that gives another advantage in terms of decoupling the pressure sensor from the substrate. FEM simulation has shown that this trench produces further 20% of reduction of drift due to substrate deformation. Another benefit of this innovation is it easily enabled integration in the same die of pressure sensor and other inertial sensors A goal of embodiments of the present invention is to achieve better performance than the prior art solutions in terms of reducing package stress sensitivity. However, embodiments of the present invention use other solutions such as the external trench in the package substrate to further reduce thermo mechanical stress impact.

Figure 7:
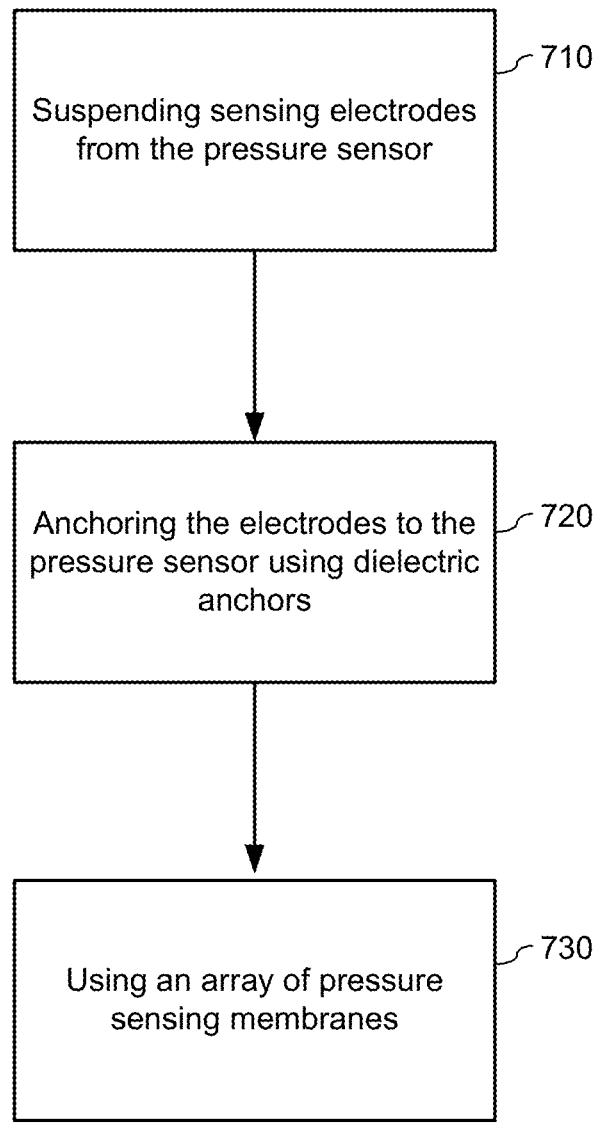
FIG. 7 shows a flowchart of a method, in accordance with various aspects of the present invention.

FIG. 7 shows a flowchart of a method, in accordance with various aspects of the present invention. FIG. 7 shows suspending sensing electrodes from the pressure sensor 710, anchoring the electrodes to the pressure sensor using dielectric anchors 720, and using an array of pressure sensing membranes 730. Using the method shown in FIG. 7 reduces sensitivity to thermal and mechanical stresses.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications, combinations, permutations, and variations as may fall within the spirit and scope of the appended claims.

What is claimed is:

1. A system for providing thermo-mechanical insensitivity, comprising:
   a sealed cavity;
   an array of membranes acting as pressure sensors within the sealed cavity;
   a plurality of sensing electrodes, wherein the sensing electrodes are suspended within the sealed cavity; and
   dielectric anchors coupled to the sensing electrodes and the sensing membranes.

2. The system of claim 1, wherein the dielectric anchors are made of silicon dioxide.

3. The system of claim 1, wherein the dielectric anchors are made of silicon nitride.

4. The system of claim 1, wherein the sensing electrodes are made of poly crystalline silicone.

5. The system of claim 1, wherein the sensing electrodes are made of mono crystalline silicon.

6. The system of claim 1, wherein the sensing electrodes are made of aluminum.

7. The system of claim 1, wherein the suspension is achieved using a membrane with a plurality of pillars that act as anchors to the sensing electrode.

8. The system of claim 1, wherein the array of pressure sensors is comprised of twenty five membranes.

9. The system of claim 1, wherein the system is integrated in a single die with inertial sensors.

10. A system for providing thermo-mechanical insensitivity, comprising:
    a cap wafer;
    a structural layer;
    an array of pressure sensing electrodes;
    a plurality of suspended sensing electrodes;
    a plurality of dielectric anchors used to suspend the suspended sensing electrodes; and
    decoupling trenches to provide decoupling between a substrate and the suspended sensing electrodes.

11. The system of claim 10, wherein the suspended sensing electrode is realized using the structural layer of the sensing electrodes.

12. The system of claim 10, wherein the dielectric anchors are realized using a residual of sacrificial oxide removed to release the structural layer.

* * * * *